United States Patent
Hunt et al.

(10) Patent No.: US 9,040,120 B2
(45) Date of Patent: May 26, 2015

(54) INORGANIC NANOCOATING PRIMED ORGANIC FILM

(75) Inventors: Andrew Hunt, Norcross, GA (US); Yongdong Jiang, Johns Creek, GA (US); Kenneth Scott Laverdure, Plano, TX (US); Anthony Robert Knoerzer, Parker, TX (US)

(73) Assignee: FRITO-LAY NORTH AMERICA, INC., Plano, TX (US)

( * ) Notice: Subject to any disclaimer, the term of this patent is extended or adjusted under 35 U.S.C. 154(b) by 396 days.

(21) Appl. No.: 13/204,483

(22) Filed: Aug. 5, 2011

(65) Prior Publication Data
US 2013/0034667 A1     Feb. 7, 2013

(51) Int. Cl.
*C23C 16/00* (2006.01)
*C23C 16/40* (2006.01)
*C23C 16/02* (2006.01)
*C23C 16/50* (2006.01)
(Continued)

(52) U.S. Cl.
CPC .............. *C23C 16/40* (2013.01); *C23C 16/0272* (2013.01); *C23C 16/402* (2013.01); *C23C 16/50* (2013.01); *C23C 14/02* (2013.01); *C23C 16/02* (2013.01); *C23C 16/401* (2013.01); *C23C 16/453* (2013.01)

(58) Field of Classification Search
CPC ........ C23C 14/14; C23C 14/56; C23C 16/06; C23C 16/545; C23C 28/32
USPC ............... 427/585, 569, 248.1, 255.7, 255.29
See application file for complete search history.

(56) References Cited

U.S. PATENT DOCUMENTS

| 3,113,888 A | 12/1963 | Gold |
| 3,477,970 A | 11/1969 | Beeman |

(Continued)

FOREIGN PATENT DOCUMENTS

| DE | 19523530 C1 | 9/1996 |
| DE | 10347015 A1 | 4/2005 |

(Continued)

OTHER PUBLICATIONS

Agarwal, Mukul, et al. "Characterization of the Degradation of Polylactic Acid Polymer in a Solid Substrate Environment," Biotechnol. Prog. 1998, vol. 14, pp. 517-526 (10 pages).

(Continued)

*Primary Examiner* — David Turocy
(74) *Attorney, Agent, or Firm* — Colin P. Cahoon; James R. Gourley; Carstens & Cahoon, LLP (57) ABSTRACT

An inorganic nanolayer surface coated polymer film product is disclosed with enhancements such as improved metallization capability, low cost, low polymer additives and modifiers, improved recyclability, and good web properties. Also method for priming a flexible film substrate to enhance the reactivity or wettability of the substrate for metallization is disclosed. A substrate film is coated with one or more nanolayers of a metal or metal oxide applied by CCVD and/or PECVD at open atmosphere. The deposited coating acts to enhance the surface energy of the film substrate and to and reduce the surface gauge variation of the substrate or supporting film, thereby enhancing the wettability of the film substrate for metallization and/or to improve the anti-block characteristics of the film. The deposited coatings may also act as a barrier layer for lowering the permeability of light, gas and vapor transmission through the substrate.

25 Claims, 4 Drawing Sheets

(51) Int. Cl.
*C23C 14/02* (2006.01)
*C23C 16/453* (2006.01)

(56) References Cited

U.S. PATENT DOCUMENTS

| | | | |
|---|---|---|---|
| 3,498,798 A | 3/1970 | Baur | |
| 3,647,111 A | 3/1972 | Stager | |
| 4,198,256 A | 4/1980 | Andrews | |
| 4,414,045 A | 11/1983 | Wang | |
| 4,418,841 A | 12/1983 | Eckstein | |
| 4,551,371 A | 11/1985 | Eckstein | |
| 4,647,332 A | 3/1987 | Ranger | |
| 4,859,513 A | 8/1989 | Gibbons | |
| 4,892,911 A | 1/1990 | Genske | |
| 4,982,872 A | 1/1991 | Avery | |
| 5,057,182 A | 10/1991 | Wuchinich | |
| 5,059,804 A | 10/1991 | Fink | |
| 5,108,807 A | 4/1992 | Tucker | |
| 5,153,061 A | 10/1992 | Cavagna | |
| 5,155,604 A | 10/1992 | Miekka | |
| 5,180,765 A | 1/1993 | Sinclair | |
| 5,192,620 A | 3/1993 | Chu | |
| 5,205,473 A | 4/1993 | Coffin | |
| 5,213,858 A | 5/1993 | Tanner et al. | |
| 5,216,043 A | 6/1993 | Sipinen | |
| 5,230,963 A | 7/1993 | Knoerzer | |
| 5,296,070 A | 3/1994 | Take | |
| 5,332,586 A | 7/1994 | DiMino | |
| 5,391,423 A | 2/1995 | Wnuk | |
| 5,458,933 A | 10/1995 | Suskind | |
| 5,487,940 A | 1/1996 | Bianchini | |
| 5,500,459 A | 3/1996 | Hagemeyer | |
| 5,506,036 A | 4/1996 | Bergerioux | |
| 5,508,113 A | 4/1996 | Knoerzer | |
| 5,512,338 A | 4/1996 | Bianchini | |
| 5,525,421 A | 6/1996 | Knoerzer | |
| 5,540,962 A | 7/1996 | Suskind | |
| 5,587,048 A | 12/1996 | Streisel | |
| 5,604,042 A | 2/1997 | Bianchini | |
| 5,631,066 A | 5/1997 | O'Brien | |
| 5,654,039 A | 8/1997 | Wenzel et al. | |
| 5,679,421 A | 10/1997 | Brinton, Jr. | |
| 5,731,093 A | 3/1998 | Chang | |
| 5,736,204 A | 4/1998 | Suskind | |
| 5,747,633 A | 5/1998 | Ito | |
| 5,750,225 A | 5/1998 | Petty | |
| 5,756,651 A | 5/1998 | Chen | |
| 5,766,637 A | 6/1998 | Shine | |
| 5,776,842 A | 7/1998 | Wood | |
| 5,837,383 A | 11/1998 | Wenzel et al. | |
| 5,849,374 A | 12/1998 | Gruber | |
| 5,895,723 A | 4/1999 | Utz | |
| 5,908,918 A | 6/1999 | Chen | |
| 5,939,467 A | 8/1999 | Wnuk | |
| 5,948,546 A | 9/1999 | Bafford | |
| 5,985,772 A | 11/1999 | Wood | |
| 6,003,670 A | 12/1999 | Beer | |
| 6,025,028 A | 2/2000 | Asrar | |
| 6,027,677 A | 2/2000 | Ostapchenko | |
| 6,033,747 A | 3/2000 | Shiotani | |
| 6,071,618 A | 6/2000 | Cook | |
| 6,080,478 A | 6/2000 | Karhuketo | |
| 6,132,822 A | 10/2000 | Overcash | |
| 6,146,508 A | 11/2000 | Gopalraja | |
| 6,168,857 B1 | 1/2001 | Andersen | |
| 6,176,953 B1 | 1/2001 | Landreth | |
| 6,183,814 B1 | 2/2001 | Nangeroni et al. | |
| 6,193,911 B1 | 2/2001 | Hunt | |
| 6,200,404 B1 | 3/2001 | Andersen | |
| 6,207,792 B1 | 3/2001 | Gruber | |
| 6,232,389 B1 | 5/2001 | Feeney | |
| 6,235,825 B1 | 5/2001 | Yoshida | |
| 6,245,437 B1 | 6/2001 | Shiiki | |
| 6,248,430 B1 | 6/2001 | Toyoda | |
| 6,285,922 B1 | 9/2001 | Bloss | |
| 6,294,047 B1 | 9/2001 | Chakar | |
| 6,301,860 B1 | 10/2001 | Gunderman | |
| 6,338,870 B1 | 1/2002 | Jaccoud | |
| 6,350,531 B1 | 2/2002 | Sugimoto | |
| 6,358,576 B1 | 3/2002 | Adur | |
| 6,361,609 B1 | 3/2002 | Ouellette | |
| 6,387,211 B1 | 5/2002 | Chakar | |
| 6,492,613 B2 * | 12/2002 | Bollinger et al. | 219/121.54 |
| 6,511,563 B2 | 1/2003 | Roylance | |
| 6,523,732 B1 | 2/2003 | Popoola | |
| 6,544,607 B1 | 4/2003 | Kuroki | |
| 6,547,929 B2 | 4/2003 | Bobsein | |
| 6,573,340 B1 | 6/2003 | Khemani | |
| 6,574,944 B2 | 6/2003 | Capodieci | |
| 6,576,294 B1 | 6/2003 | Phillips | |
| 6,600,008 B1 | 7/2003 | Kobayashi | |
| 6,645,584 B1 | 11/2003 | Kuusipaio | |
| 6,649,732 B2 | 11/2003 | Kobayashi | |
| 6,660,008 B1 | 12/2003 | Foerster | |
| 6,660,211 B2 | 12/2003 | Topolkaraev | |
| 6,677,048 B2 | 1/2004 | Karhuketo | |
| 6,709,718 B2 | 3/2004 | O'Brien | |
| 6,716,499 B1 | 4/2004 | Vadhar | |
| 6,740,731 B2 | 5/2004 | Bigg | |
| 6,769,229 B2 | 8/2004 | Kinigakis | |
| 6,811,826 B2 * | 11/2004 | Rule et al. | 427/407.1 |
| 6,815,079 B2 | 11/2004 | Rosenbaum | |
| 6,824,632 B2 | 11/2004 | Blanchard | |
| 6,863,644 B1 | 3/2005 | Cook | |
| 6,877,975 B2 | 4/2005 | Wuchinich | |
| 6,942,821 B2 | 9/2005 | Davrit | |
| 6,960,374 B1 | 11/2005 | Terada | |
| 6,974,612 B1 | 12/2005 | Frisk | |
| 6,977,113 B2 | 12/2005 | Kody | |
| 6,984,443 B2 | 1/2006 | Kuroki | |
| 7,060,142 B2 | 6/2006 | Yamamoto | |
| 7,128,969 B2 | 10/2006 | Busch | |
| 7,132,490 B2 | 11/2006 | Obuchi et al. | |
| 7,160,977 B2 | 1/2007 | Hale | |
| 7,172,814 B2 | 2/2007 | Hudson | |
| 7,173,080 B2 | 2/2007 | Yamada | |
| 7,214,414 B2 * | 5/2007 | Khemani et al. | 428/34.3 |
| 7,223,359 B2 | 5/2007 | Torkelson | |
| 7,351,449 B2 * | 4/2008 | Hunt et al. | 427/248.1 |
| 7,351,785 B2 | 4/2008 | Matsumoto | |
| 7,368,160 B2 | 5/2008 | Inglis | |
| 7,422,782 B2 | 9/2008 | Haedt | |
| 7,514,528 B2 | 4/2009 | Kauffman | |
| 7,520,959 B2 | 4/2009 | Kikuchi | |
| 7,718,718 B2 | 5/2010 | Kanzawa | |
| 7,771,551 B2 | 8/2010 | Schroeder | |
| 7,785,682 B2 | 8/2010 | Sato et al. | |
| 7,794,555 B2 | 9/2010 | LaFond | |
| 7,854,994 B2 | 12/2010 | Henderson-Rutgers | |
| 7,943,218 B2 | 5/2011 | Knoerzer | |
| 7,951,436 B2 | 5/2011 | Knoerzer | |
| 7,951,438 B2 | 5/2011 | Lee | |
| 8,105,667 B2 | 1/2012 | Knoerzer | |
| 8,201,606 B2 | 6/2012 | Specht | |
| 8,225,583 B2 | 7/2012 | Waldherr | |
| 8,507,084 B2 | 8/2013 | Deng | |
| 8,734,933 B2 | 5/2014 | Paolilli et al. | |
| 8,795,803 B2 | 8/2014 | Paolilli et al. | |
| 8,859,056 B2 | 10/2014 | O'Neill et al. | |
| 2001/0001284 A1 | 5/2001 | Shaw | |
| 2002/0014318 A1 | 2/2002 | Bobsein | |
| 2002/0058143 A1 | 5/2002 | Hunt | |
| 2002/0098341 A1 | 7/2002 | Schiffer | |
| 2002/0160201 A1 | 10/2002 | Ohkura | |
| 2003/0008136 A1 | 1/2003 | Bliznyuk | |
| 2003/0162013 A1 | 8/2003 | Topolkaraev | |
| 2003/0166748 A1 | 9/2003 | Khemani | |
| 2003/0193104 A1 | 10/2003 | Melican | |
| 2003/0215644 A1 | 11/2003 | Deshpande | |
| 2004/0029258 A1 | 2/2004 | Heaney | |
| 2004/0076778 A1 | 4/2004 | Mori | |
| 2004/0115424 A1 | 6/2004 | Cowton | |
| 2004/0185287 A1 | 9/2004 | Reighard | |
| 2004/0229327 A1 | 11/2004 | Agblevor | |

(56) References Cited

U.S. PATENT DOCUMENTS

| | | |
|---|---|---|
| 2005/0096422 A1 | 5/2005 | Torkelson |
| 2005/0112363 A1 | 5/2005 | Ning |
| 2005/0136202 A1 | 6/2005 | Kendig |
| 2005/0194110 A1 | 9/2005 | Richardson |
| 2006/0019045 A1 | 1/2006 | Bourgeois |
| 2006/0046006 A1* | 3/2006 | Bastion et al. ............... 428/35.2 |
| 2006/0057260 A1 | 3/2006 | Barry |
| 2006/0069234 A1 | 3/2006 | Kauffman |
| 2006/0099436 A1 | 5/2006 | Schwark |
| 2006/0110615 A1 | 5/2006 | Karim |
| 2006/0144905 A1 | 7/2006 | Oblak |
| 2006/0159860 A1 | 7/2006 | Korowicki |
| 2006/0177674 A1 | 8/2006 | Aritake |
| 2006/0194010 A1 | 8/2006 | Hiscock |
| 2006/0207295 A1 | 9/2006 | Huenermann |
| 2006/0275563 A1 | 12/2006 | Duffy |
| 2006/0286323 A1 | 12/2006 | Siegel |
| 2007/0037912 A1 | 2/2007 | Mohanty |
| 2007/0059541 A1 | 3/2007 | Yoshida |
| 2007/0154719 A1 | 7/2007 | Meijlink et al. |
| 2007/0158012 A1 | 7/2007 | Heil |
| 2007/0184220 A1 | 8/2007 | Cleveland |
| 2007/0224368 A1 | 9/2007 | Hara |
| 2007/0259139 A1 | 11/2007 | Furneaux |
| 2008/0038560 A1 | 2/2008 | Knoerzer |
| 2008/0069988 A1 | 3/2008 | Sato |
| 2008/0070047 A1 | 3/2008 | Rehkugler |
| 2008/0073505 A1 | 3/2008 | Niu |
| 2008/0107847 A1 | 5/2008 | Yamane et al. |
| 2008/0131616 A1 | 6/2008 | Besson |
| 2008/0241500 A1 | 10/2008 | Hoegg |
| 2009/0017240 A1 | 1/2009 | Charbonnel et al. |
| 2009/0022919 A1 | 1/2009 | Chicarella |
| 2009/0061126 A1 | 3/2009 | Knoerzer |
| 2009/0081396 A1 | 3/2009 | Hokari et al. |
| 2009/0142614 A1 | 6/2009 | Mori |
| 2009/0148713 A1 | 6/2009 | Lee |
| 2009/0148715 A1 | 6/2009 | Lee |
| 2009/0194450 A1 | 8/2009 | Dabadie |
| 2009/0199964 A1* | 8/2009 | Fayet et al. ................... 156/278 |
| 2009/0200359 A1 | 8/2009 | Chen |
| 2009/0220794 A1 | 9/2009 | O'Neill |
| 2009/0250171 A1 | 10/2009 | Wieduwilt |
| 2009/0269580 A1* | 10/2009 | Shiba et al. ................... 428/340 |
| 2009/0286090 A1 | 11/2009 | Ting |
| 2009/0311544 A1 | 12/2009 | Lee |
| 2009/0324917 A1 | 12/2009 | Wang |
| 2009/0324972 A1* | 12/2009 | Hoffman et al. ............. 428/446 |
| 2010/0009208 A1 | 1/2010 | Lee |
| 2010/0040904 A1* | 2/2010 | Cloutier et al. ............... 428/626 |
| 2010/0062269 A1 | 3/2010 | Ogita |
| 2010/0072104 A1 | 3/2010 | Kohl |
| 2010/0101722 A1 | 4/2010 | Suto |
| 2010/0147466 A1 | 6/2010 | Marimon |
| 2010/0151130 A1 | 6/2010 | Ammerlaan |
| 2010/0178394 A1 | 7/2010 | Exner |
| 2010/0178523 A1 | 7/2010 | Iyengar et al. |
| 2010/0184891 A1 | 7/2010 | Akutsu et al. |
| 2010/0209614 A1 | 8/2010 | Sakata |
| 2010/0221560 A1 | 9/2010 | Knoerzer |
| 2010/0330382 A1 | 12/2010 | Dou |
| 2011/0005959 A1 | 1/2011 | Van Puijenbroek |
| 2011/0027590 A1 | 2/2011 | Abe |
| 2011/0072766 A1 | 3/2011 | Haus |
| 2011/0081543 A1 | 4/2011 | Lee |
| 2011/0104437 A1 | 5/2011 | Yamamura |
| 2011/0200844 A1 | 8/2011 | Fayne |
| 2011/0244185 A1 | 10/2011 | Dou |
| 2012/0111476 A1 | 5/2012 | Bang |
| 2012/0141766 A1 | 6/2012 | Paulino |
| 2012/0219790 A1 | 8/2012 | Mount |
| 2012/0288693 A1 | 11/2012 | Stanley et al. |
| 2013/0101831 A1 | 4/2013 | Knoerzer et al. |
| 2013/0101855 A1 | 4/2013 | Cham |
| 2013/0122280 A1 | 5/2013 | Yokota |

FOREIGN PATENT DOCUMENTS

| | | |
|---|---|---|
| EP | 0058571 A1 | 8/1982 |
| EP | 0229476 A1 | 7/1987 |
| EP | 0333390 A3 | 9/1989 |
| JP | 2000-185381 | 7/2000 |
| JP | 2003-191425 | 7/2003 |
| JP | 2003-276144 | 9/2003 |
| JP | 2004-106314 A | 4/2004 |
| JP | 2004-256570 | 9/2004 |
| JP | 2004-351629 | 12/2004 |
| JP | 2007-083409 A | 4/2007 |
| JP | 2011-063002 A2 | 3/2011 |
| WO | 96/01736 | 1/1996 |
| WO | 96/18544 A1 | 6/1996 |
| WO | 96/31303 | 10/1996 |
| WO | 2004-093883 A2 | 11/2004 |
| WO | 2006/029835 A1 | 3/2006 |
| WO | 2007/047133 A1 | 4/2007 |
| WO | 2012/085060 A1 | 6/2012 |

OTHER PUBLICATIONS

Devlieger, J.J., "Green plastics for food packaging," TNO Industrial Technology, Chapter 24, pp. 519-534, The Netherlands, date unknown.

Goldsberry, Clare, "The Greening of an Industry: PLA film coatings replacing thermoplastics," Modern Plastics Worldwide magazine, Feb. 2007, pp. 54 and 56, United States.

Kolybaba, M., "Biodegradable Polymers: Past, Present, and Future" The Society for Engineering in Agricultural, Food, and Biological Systems, Paper No. RRV03-00007, Oct. 2003, 15 pages.

Liu, Lillian, "Bioplastics in Food Packaging: Innovative Technologies for Biodegradable Packaging" San Jose State University Packaging Engineering, Feb. 2006, 13 pages.

Malwitz, Matthew M., et al., "Orientation of Platelets in Multilayered Nanocomposite Polymer Films," Journal of Polymer Science: Part B: Polymer Physics, vol. 41, 3237-3248 (2003) © Wiley Periodicals, Inc., United States.

NatureWorks LLC PLA Polymer 4032D "Biaxially Oriented Films—High Heat" pp. 1-3, © 2005.

NatureWorks LLC Health and Safety, "Material Safety Data Sheet" pp. 1-10, Jul. 19, 2006.

Kim & Chang translation of excerpt of Japanese Patent Publication No. 2011/063002 A2 published on Mar. 31, 2011 (1 page).

Machine translation of German Patent Publication No. DE10347015 A1 published on Apr. 28, 2005 (5 pages).

Machine translation of Japanese Patent Publication No. 2011/063002 A2 published on Mar. 31, 2011 (18 pages).

"Nanophasen-Materialen" In: Rompp Lexikon Chemie, 10. Auflage, 1998, Thieme Verlag, Stuttgart, ISBN: 3-13-734910-9, vol. 4, p. 2804 (3 pages).

PCT International Search Report dated Nov. 22, 2013, from PCT Application No. PCT/US13/47106 (7 pages).

PCT International Search Report dated Dec. 2, 2013, from PCT Application No. PCT/US13/47128 (8 pages).

PCT International Search Report dated Feb. 21, 2014, from PCT Application No. PCT/US13/53473 (6 pages).

PCT International Search Report dated Feb. 21, 2014 from PCT Application No. PCT/US13/53478 (6 pages).

PCT International Search Report dated Apr. 3, 2014 from PCT Application No. PCT/US13/68512 (10 pages).

Tokiwa, Yutaka, "Biodegradability of Plastics," Int. J. of Mol. Sci. Sep. 2009, 10(9):3722-3724, published online Aug. 26, 2009 (18 pages).

* cited by examiner

INORGANIC NANOCOATING PRIMED ORGANIC FILM

BACKGROUND OF THE INVENTION

1. Technical Field

The present invention relates to an elemental layer on organic film product and the method and apparatus for applying the elemental layer. More specifically, the invention disclosed herein pertains to an inorganic layer that serves to keep polymer film from welding to itself when rolled or stacked but can also serve as an interface for future functionalization. This nanolayer can be formed during the original manufacturing of the polymer film by the use of chemical vapor deposition apparatus and is compatible with methods for depositing anti-block, primer, and/or high quality barrier layers on the surface of a film substrate to improve characteristics of the film substrate.

2. Description of Related Art

Multi-layered film structures made from petroleum-based products, polymers, copolymers, bio-polymers and paper substrates are often used in flexible films and packaging structures where there is a need for advantageous barrier, sealant, and graphics-capability properties. Barrier properties in one or more layers comprising the film are important in order to protect the product inside the package from light, oxygen and/or moisture. Such a need exists, for example, for the protection of foodstuffs that may run the risk of flavor loss, staling, or spoilage if sufficient barrier properties are not present to prevent transmission of light, oxygen, or moisture into the package. A graphics capability may also be required so as to enable a consumer to quickly identify the product that he or she is seeking to purchase, which also allows food product manufacturers a way to label information such as the nutritional content of the packaged food, and present pricing information, such as bar codes, to be placed on the product.

In the packaged food industry, protecting food from the effects of moisture and oxygen is important for many reasons, such as, health safety and consumer acceptability (i.e., preserving product freshness and taste). Conventional methods to protect food contents incorporate specialized coatings or layers within or on a surface of the substrate which function as an impervious barrier to prevent the migration of light, water, water vapor, fluids and foreign matter into the package. These coatings may consist of coextruded polymers (e.g., ethyl vinyl alcohol, polyvinyl alcohol, and polyvinyl acetate) and/or a thin layer of metal or metal oxide, depending on the level of barrier performance required to preserve the quality of the product stored in the package substrate.

Coatings produced by chemical vapor deposition are known to provide certain barrier characteristics to the coated substrate. For example, an organic coating such as amorphous carbon can inhibit the transmission of elements such as water, oxygen and carbon dioxide. Accordingly, carbon coatings have been applied to substrates, such as polymeric films, to improve the barrier characteristics exhibited by the substrate. Another example of coatings applied to substrates to improve barrier adhesion performance includes coatings comprised of inorganic materials such as inorganic metal oxides. Ethyl Vinyl Alcohol (EVOH) and other polymer skin layers are widely used to prime or improve the wettability of film substrates for the application of a barrier layer (also referred to herein as "metallization primer"). Aluminum metal, aluminum oxide, and silicon oxide are widely used for the direct application of barrier layer(s) directly to the substrates (also referred to herein as "metallization"). Aluminum oxides and silicon oxides also provide abrasion resistance due to their glass-like nature.

The inorganic coatings described above may be deposited on to substrates through various techniques as known in the art. Such techniques include vapor deposition, either physical vapor deposition (PVD) or chemical vapor deposition (CVD). Examples of PVD include ion beam sputtering and thermal evaporation. Examples of CVD include glow discharge, combustion chemical vapor deposition (CCVD) and plasma enhanced chemical vapor deposition (PECVD). All such coatings are now made in a secondary process after the film has been formed and either wound or stacked.

The most commonly known and utilized method for depositing barrier layers on film packaging substrates for metallization requires the use of a vacuum chamber to provide the vacuum environment for the deposition of inorganic atoms/ions on to the film substrate surface. This known technique, as used in the food packaging industry, consists of processing packaging film rolls which are from less than 1 to three meters wide and 500 to 150,000 meters in length running at industry speeds of 60-300 meters/min in a vacuum metallization chamber. This equipment is highly specialized, requires a great deal of electrical power and is capital intensive. Current vacuum chamber processes for metalizing films is inefficient in many respects due to the high capital/operating costs and limited operational/production capacity associated with the use of such equipment, and the requirement to use high end film to achieve the desired barrier.

Combustion chemical vapor deposition (CCVD) and plasma enhanced chemical vapor deposition (PECVD) apparatus and methods are known in the art, as disclosed in U.S. Pat. Nos. 5,997,996 and 7,351,449, the disclosures of which are hereby incorporated by reference. Typically, a combustion flame or plasma field provides the environment required for the deposition of the desired coating via the vapors and gases generated by the combustion or plasma on to the substrate. The elemental precursors (e.g. organometallics) may be vaporous or dissolved in a solvent that may also act as a combustible fuel. The deposition of organic and inorganic oxides may then be carried out under standard and/or open atmospheric pressures and temperatures without the need of a vacuum chamber, furnace and/or pressure chamber.

As described above, the application of barrier to food packaging is required to protect food and food products from the effects of moisture and oxygen. It is well known in the art that metalizing a petroleum-based polyolefin such as OPP or PET reduces the moisture vapor and oxygen transmission through specialty film by approximately three orders of magnitude. Conventional technology is to employ an inorganic layer of metal or ceramic on a special polymer film. The inorganic layer may be aluminum, silicon, zinc, or other desired element in a metal or oxide form. However, the surface of the substrate on to which the barrier layer will be applied typically needs to be primed to increase its surface energy so as to be receptive to the deposition of the metal barrier to be deposited thereon and/or to "smooth" the surface to be metalized so as to reduce the surface gauge variation or surface roughness of the film to be metalized. The term "wettability" is defined herein to include surface energy, metal adhesion bond strength, and any other associated characteristic which would increase the receptiveness of the film layer surface for deposition of coatings.

For example, the utilization of aluminum metal as a barrier layer on low energy plastics, such as biaxially oriented polypropylene (BOPP) film, requires a metallization primer to reduce the gauge variation of the film substrate surface and/or to improve the adhesion or bond between the metal and film substrate. Various chemical methods are employed to prime the substrate surface layer for improving the substrate surface and/or bonding of the metal barrier layer to the film substrate. With polymer film substrates, one method to prime the substrate for metallization is to co-extrude a specialized polymer as a skin layer on the substrate film. These skin layers may comprise ethyl vinyl alcohol (EVOH), polyvinyl alcohol (PVOH), and polyvinyl acetate (PVA), Ethyl Vinyl Acetate (EVA), Polyethylene Terephthalate Glycol (PETG), amorphous Polyethylene Terephthalate (aPET), among other polymers used in the industry. Unfortunately, these materials are quite expensive and add additional cost to the manufacture of metallization ready films. Also having multiple polymer compositions reduces recyclability of the product.

Plastic film cores, such as OPP, polystyrene (PS), and polyethylene terephthalate (PET) are typically treated with corona discharge or flame treatment. This helps increase wettability. However, these treatments tend to create undesired, adverse impacts on film substrate characteristics such as the formation of pin holes, chemical degradation of the surface through cross linking or intramolecular chain scission that can adversely affect downstream metallization and heat sealing processes.

After formation, the film substrates are typically wound around a core into a roll for storage and distribution. Additional additives, such as slipping agents, anti-statics and anti-blocks as previously described, are usually incorporated into substrate films before winding and migrate to the surface of the film substrate in order to prevent or minimize blocking, welding or "sticking" of the film surfaces when the film is wound. The addition of conventional slip and/or anti-block additives interferes with establishing an effective metalized barrier layer and tends to degrade the performance of the film substrate, as the anti-block additive particles, along with other environmental particles such as dust, are transferred from the sealant layer of the film to the metallization surface layer during the winding process. The presence of these particles increases the surface roughness, surface gauge variance of the film, and forms holes or gaps in the metalized layer later deposited. Slip agents and anti-statics decrease the wettability of the film surface for metallization and further degrade the metal adhesion and barrier potential of the film.

As such, there exists a need for a polymer film product that does not contain such additives, but does not weld to itself and can still be processed on conventional film web handling equipment. To accomplish this end, there is a need in the art for a more efficient and economical apparatus and method to prime a substrate for metallization. Likewise, a need exists in the art for an improved apparatus and method for improving the barrier of a substrate which is less expensive and more energy efficient than tradition metallization, while achieving and maintaining high quality barrier characteristics. Additionally, a need exists in the art for an improved apparatus and method for treating film substrates without the need for the addition of conventional anti-block or slip agents to reduce blocking of the film in an in-line manufacturing environment.

SUMMARY OF THE INVENTION

The inventive embodiments disclosed herein include a film substrate with an inorganic nanocoating layer product, an apparatus and method for priming a film substrate for metallization, apparatus and method for improving the anti-block characteristics of a film substrate, and apparatus and method for applying a metal barrier to a film substrate. In one embodiment, the apparatus and method disclosed herein use the direct combustion of liquids, gases and/or vapors that contain the chemical precursors or reagents to be deposited on to the surface of a film substrate at open atmospheres. Chemical precursors, for example organic solvents, may be sprayed or atomized in an oxidant and combusted resulting in a vapor and/or gas which is directed on to the surface of the substrate forming the desired coating thereon. Multiple coating layers may be deposited on to the substrate by repetitively passing the substrate through the system in either a stand-alone or in-line manufacturing environment.

One embodiment of the present invention comprises a smooth polymer substrate surface with an inorganic nanocoating layer of less than 50 nm thickness that substantially inhibits welding of the film substrate to itself. In other embodiments, a thinner nanocoating layer or layers may be preferred with less than 5 nm average thickness, thereby providing the desired anti-block effect for most applications while still allowing a quality barrier film to be applied to its surface. Since polymer films are usually wound or stacked into rolls during the manufacturing process, the inorganic nanocoating layer should be formed during the manufacture of the polymer film or product prior to the film substrate contacting another polymer. These polymer film or product manufacturing lines move at high speeds at ambient pressures and can be tens of feet wide. In one embodiment, a preferred process that can accomplish inorganic nanocoating of the polymer film or product in such an open environment is combustion chemical vapor deposition (CCVD), although any inorganic thin film process can be used as desired if it is capable of achieving the desired properties.

The inventive embodiments described herein may be implemented in stand-alone configurations, retrofitted to existing film production lines, or installed into an in-line film substrate manufacturing and/or processing system. The substrate material to be coated does not need to be heated or treated in a furnace or reaction chamber, or placed under vacuum or non-standard atmospheric conditions to effect coating deposition. The heat of combustion provides the needed conditions for the reaction of the chemical precursors. The substrate material being coated is likewise heated by the combustion flame, which creates and/or enhances the kinetic environment for surface reactions, wettability, diffusion, film (coating) nucleation and film (coating) growth. The chemical precursors utilized need to be properly reactive to form the desired coating. While oxides are the preferred material, other elemental coatings and compounds, for example metals, nitrides, carbides, and carbonates may also be used as desired.

Other aspects, embodiments and features of the invention will become apparent from the following detailed description of the invention when considered in conjunction with the accompanying figures. The accompanying figures are schematic and are not intended to be drawn to scale. For purposes of clarity, not every component is labeled in every figure, nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

BRIEF DESCRIPTION OF THE FIGURES

The novel features believed characteristic of the invention are set forth in the appended claims. The invention itself, however, as well as a preferred mode of use, further objectives and advantages thereof, will be best understood by reference to the following detailed description of illustrative embodiments when read in conjunction with the accompanying figures, wherein:

DETAILED DESCRIPTION

Figure 1:
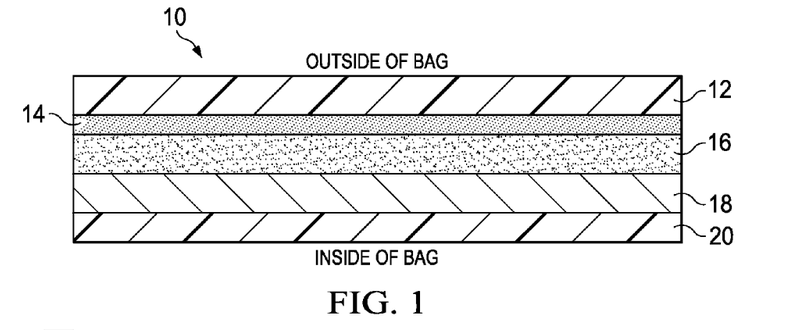
FIG. 1 depicts a cross-section view of a typical prior art food packaging film substrate.

FIG. 1 depicts a schematic cross-section of a typical, currently used food packaging multi-layer or composite film 10. Film 10 is constructed of various intermediate polymer layers that act in concert to provide the film 10 with the required performance characteristics. For example, a graphics layer 14 allows a graphic to be printed or otherwise disposed thereon and is protected by transparent exterior base layer 12 which may consist of oriented polypropylene (OPP) or polyethylene terephthalate (PET). A glue or laminate layer 16, which is typically a polyethylene extrusion, acts to bind the exterior layers 12 and 14 with the inner, product-side base layer 18. A metal layer may be disposed upon inner base layer 18 by means of metallization known in the art. Sealant layer 20 is disposed upon the OPP or PET interior base layer 18 to enable a hermetic seal to be formed at a temperature lower than the melt temperature of the interior base layer 18. Each layer described is formed as a roll of film that is then unwound and laminated together to form the composite film. Each film being laminated together make the composite films, which are films composed of multiple layers, as exemplified in FIG. 4, when originally extruded or fabricated. The inorganic nanolayer of the present invention could be present on any of the layers surfaces and would result in being an interface inorganic nanolayer between the polymer layers.

Alternative materials used in the construction of packaging film substrates may include polyesters, polyolefin extrusions, cellulosic polymers, acetate polymers, adhesive laminates, bio-films such as polylactic acid (PLA) films and polyhydroxy-alkanoate (PHA) films, produced in various combinations resulting in composite, multi-layered film structures. The film substrate may be formed by typical coextrusion, lamination, or extrusion coating techniques as known in the art. The film substrate can also be composed of polyimide, liquid crystal, polyethylene, or other materials normally used in electronic, optic or specialty packaging or multilayer applications.

In both PECVD and CCVD processes described herein, the environment required for coating deposition to occur is provided by the flame or other energy means. With CCVD no furnace, auxiliary heating, or reaction chamber is necessary for the reaction to occur. Further, both PECVD and CCVD can be carried out in near ambient open-atmosphere conditions. The plasma or flame supplies the energy needed for coating deposition in the forms of the kinetic energy of the species present and radiation. This energy creates the appropriate thermal environment to form reactive species and coincidentally heats the substrate, thus providing the kinetic conditions for surface reactions, diffusion, nucleation, and growth to occur. When using combustible solutions, the solvent plays two primary roles in CCVD. First, the solvent conveys the coating reagents into the vicinity of the substrate where coating deposition occurs, thereby allowing the use of low cost soluble precursors. Uniform feed rates of any reagent stoichiometry can be produced easily by simply varying the reagents' concentrations in solution and the solution flow rate. Second, the combustion of the solvent produces the flame required for CCVD. Physical vapor deposition (PVD) systems have been made that enable local area of high vacuum for the formation of PVD layers on otherwise open atmosphere manufacturing lines, these could be used but have not been found to be commercially practical. Ambient pressure systems are the preferred embodiment.

In general, the CCVD process described herein is performed under ambient conditions in the open atmosphere to produce an inorganic film on a substrate. The film preferably is amorphous, but may be crystalline, depending on the reagent and deposition conditions. The reagent, or chemically reactive compound, is dissolved or carried in a solvent, typically a liquid organic solvent, such as an alkene, alkide or alcohol. The resulting solution is sprayed from a nozzle using oxygen-enriched air as the propellant gas and ignited. A substrate is positioned at or near the flame's end. Flame blow-off may be prevented by use of a hot element such as a small pilot light. The reactants are combusted in the flame and the ions generated from the combustion are deposited on the substrate as a coating.

The methods and apparatus utilized to perform the inventive methods disclosed herein provide a less-energy intensive and more efficient method for the surface treatment of film substrates for a variety of applications. For example, priming a substrate for metallization is usually required to enhance the wettability of the substrate surface for the reception of a metalized layer. As previously discussed, prior art methods of priming a substrate for metallization typically require the addition of a skin layer via coextrusion of solution coating of chemical additives such as EVOH and/or treatment by flame or Corona discharge prior to metallization. The apparatus and methods herein provide a novel method by which the surface energy of the film substrate is raised typically between 1 and 10 dynes by the addition of the inorganic primer nanolayer, thereby enhancing the wettability of the substrate surface and thus improving the adhesion between the deposited metal barrier coating and the substrate.

In one embodiment, the inorganic surface nanolayer is deposited on to an external surface of the film substrate and terminates the polymer network of the film substrate so that it will not cross link with itself when multi-layered and stacked under wound roll or stacked material storage conditions. It is also important for the inorganic surface nanolayer to enable future vapor deposition barrier, printing or adhesive layers applied to the film substrate to adhere well and for hot seal processes to still function as desired. An integral aspect of the invention includes application of the inorganic nanolayer to the film substrate so as to improve the surface wettability of the final polymer film based product for future applications.

By using different inorganic materials, additional properties can be created to enhance the use of the film for various applications. For example, elements such as silver can provide antimicrobial/disinfection properties. In other embodiments, ultraviolet radiation blocking inorganics, such as zinc oxides and tin oxides, may be utilized to form a clear barrier nanocoating layer. Other clear materials, such as silica glasses, may used to form and/or act as excellent base nanolayer(s) barrier layer(s).

A key economic feature in using polymer-based products is maintaining low cost. As a result, the inorganic materials used as nanolayer coatings are typically selected from low cost inorganic elements. Also, the health aspect of the materials used in the formation of films for packaging is very important since the polymer films are used most often in consumer products including food and medical packaging. Thus, health safe materials such as silica-based inorganics are utilized in various embodiments. Silica is the most common oxide of the earth's crust and soil and long-term storage in glass containers has extensive proven history as a safe and effective storage medium as related to human health requirements.

Current surface modifying materials can represent a significant volume and weight fraction of the end product thus reducing its recyclability. The present invention greatly reduces the material required to retard or otherwise inhibit welding problems, thus reducing additive content of the film, resulting in a more recyclable and/or compostable product. In one an embodiment, the inorganic nanolayer is less than 10 nm thick and more preferably less than 5 nm average thickness. Due to the small thickness of such a layer, the inorganic nanolayer more readily breaks into smaller pieces resulting in a higher grade of recycle material. In fact, silica is often used as an enhancement additive to polymers improving strength and durability. An embodiment of the invention includes an inorganic nanolayer surface layer that alters the bulk physical properties of the film base polymer, as compared to reprocessing of neat polymer, by less than 1%.

For biodegradable polymers, such as PLA and PHA, a barrier layer applied thereto may in fact detract from the degradability of the packaging product made from same. Effective barrier reduces the transmission of moisture or oxygen that can help in the degradation process of the film package. Multiple layers of barrier can form a package that does not degrade due to the core film substrate material (barrier on both sides) never being exposed to the proper environment for decomposition. An embodiment of the present invention includes forming an inorganic nanocoating that alone does not provide an impervious barrier, but enables a subsequent printing, adhesion layers, or quality barrier to be deposited upon the inorganic nanocoating in a secondary processing facility (not on the original processing line where the base polymer film and the present innovation nanocoating were formed). The inorganic nanolayer can be deposited on both sides and the film can be used in multiple ways.

One of the key uses of the smooth inorganic nanocoating layer is subsequent barrier layer formation thereon. Thin film metallization or oxide barrier layers adhere and perform better on smooth surfaces with low defects. Polymer films readily form such surfaces during manufacturing, but the addition of anti-block agents as currently used in the industry cause an increase in the film's surface roughness and defects, with RMS generally greater than 100 nm. A key aspect of the present invention results is an RMS of less than 30 nm and more preferably less than 10 nm and in some cases an RMS of less than 5 nm.

Slip agents are commonly used in polymer films to enable better processing and to ensure that the film does not weld on itself These materials act as 'oil' on a surface to enable non-sticking surface characteristics and so that the material does not bind to its self at a later time in storage or the processing stream roller and winding assemblies. One embodiment of the present invention provides for the film containing no slip agents. Another embodiment is the ability to maintain low RMS values while controlling the surface wetting properties. The surface tension can be controlled by a combination of the inorganic nanocoating layer's surface roughness and also the termination material on the surface. For later adhesion of inorganic barrier layer materials it is desired that the surface be accepting of metal or oxide ionic or covalent bonding. Oxide surfaces provide excellent bonding to both metal and oxide barrier layers, and this is with a smooth surface coating. Smoothness enhances the ability to form barrier. For barrier applications, the surface should have low texture on both the nanometer and micrometer scale.

One key to successful application of such interface layers is they should be formed online when the polymer film is formed and prior to be being wound. Films are made by a number of processes including cast and blown films. These processes are typically performed in an ambient atmosphere and pressure on large production lines thereby making vacuum deposition increase from expensive to economically impractical. Thus, a method for forming films online with an inorganic nanocoating interface layer at ambient pressure on low temperature polymers is the best path to accomplish such an inventive interface nanocoating layer. Aspects of how to do this with a process such as CCVD are disclosed in U.S. Pat. No. 5,652,021 (Hunt et al.) and U.S. Pat. No. 5,863,604 (Hunt et al.), the disclosures of which are incorporated herein by reference.

In one embodiment, such an interface layer created during online manufacturing is provided as an excellent base layer onto which a barrier layer can be subsequently deposited. The inorganic interface layer also serves to keep this rolled film easy to wind by inhibiting tackiness between the adjacent film surfaces in the roll. Once formed, the inorganic interface layer is a tack free dry surface, which inhibits polymers from welding together. The film can then be later processed successfully since the inorganic interface layer is of such a composition that it does not weld or bond to the opposite polymer surface when the film is wound into a roll or stacked. The inorganic nanocoating layer material strongly bonds to the initial film substrate surface since it is preferably deposited by a vapor process where the condensation of the coating is bonded to the film substrate surface with a strength that passes tape peel tests. This is indicative of chemical, ionic or covalent type bonds as opposed to electrostatic or Vander Waals bonds which are much weaker. Since the film may proceed through multiple winding processes before being formed into a package, this bond strength to the substrate is important or the nanocoating layer may flake off, transfer to the adjacent polymer surface, or any barrier film formed onto the nanocoating layer may be delaminated at a weak interface causing barrier or laminate failure. As such, without the application of an interface nanolayer on to a surface of the film substrate, subsequent barrier deposition may not form well or be able to bond strongly enough directly to the polymer film substrate.

In one embodiment, the nanocoating interface layer only needs to be applied to one external surface of the film substrate, but may also be applied to more than one surface of the film substrate to further retard welding. In such an embodiment, treating both film surfaces with a nanocoating interface layer reduces the need to use additives which cost more than the base polymer and which also degrade the recyclability of the polymer as previously described.

In one embodiment, the primary film substrate surface to coat, if the subsequent application of a barrier coating is desired, is the smoother of the film substrate's external surfaces. Typically, one side of the film normally has a structured surface with anti-block that forms a textured surface that enables air passage as well as reduces welding contact between layers. This air venting textured surface can be important in high speed film winding and processing to allow air to into and exit the film during the winding process and can be very important in subsequent vacuum processing.

As alluded to above, it is known that in order to form a good barrier layer in subsequent processing operations, it is important for the film substrate surface to be smooth. While the slip nature of the nanocoating layer applies to rougher or smoother films, thin film barriers require a smooth surface without features that can shadow or inhibit the thin film material from being deposited onto the vast majority of the entire surface. It is preferred that at least 90% of the surface be coated and even more preferred that over 99% be accessible to vapor deposition material without surface roughness that can cause shadowing or thin film defects. It is also important that the inorganic layer is very smooth so that it will not impact the dense uniform continuous growth of the thin film barrier layer on top of it. Columnar growth to the inorganic nanolayer will hurt the subsequent growth of a vacuum or other thin film barrier layer. The end effect is that a subsequent barrier layer can be grown to yield a Oxygen Transmission Rate (OTR) of less than 10 and a Water Vapor Transmission Rate (WVTR) of less than 2, more preferably OTR <2 and WVTR <1, and even more preferably OTR <1 and WVTR <0.2. In one embodiment, the subsequent barrier layer is transparent to light in the visible spectrum with less than 2% change in light transmission compared to uncoated film being readily achievable. The light transmission may even be higher than uncoated due to creating an intermediate index of refraction. In alternative embodiments, the subsequent barrier layer may be translucent or opaque as appropriate for effective utilization of the coated film substrate for flexible packaging or other contemplated end use.

The current invention has low environmental impact and could yield safer packaging material as a result of the reduction in the number of organic chemicals blended into the polymer film substrate. Such additives can cause health concerns or can reduce the quality of recyclable material. Silica and the other elements of the present invention are common in the earth's crust, are often used as food additives, and have been used safely in glass containers for many years. As a result, the invention disclosed herein utilizes plentiful and safe inorganic materials with no detrimental environmental impact as a result of such use.

Some polymer film substrates are bound together into multilayer structures that may decompose or biodegrade. In one embodiment, the invention disclosed herein forms such a thin inorganic nanocoating layer, it does not act as a barrier layer alone. Thus, such an inorganic nanocoating layer may be used as a slip replacement layer and not just when future barrier layers are needed in secondary processing. Multilayer packaging can still be produced with excellent bonding provided by application of the inorganic nanocoating layer as described herein. Also moisture, oxygen and light can pass through the inorganic nanocoating layer so that compostable polymer film structures can still be decomposed. Moreover, anti-block and slip agents, depending on their chemical nature, may possess a degree of environmental toxicity, as defined by the ASTM D6400 family of standards for compostability. The inorganic nanocoating with proper selection of metal element, such as silicon, creates a thin coating which will not inhibit composting of the film substrate and which has no proven toxicity to humans with an absolute minimal impact on the environment.

In one embodiment disclosed herein, a PECVD or CCVD apparatus is used to deposit nanolayers of silica oxides ($SiO_x$) and/or other inorganic oxides on the surface of the substrate in an open atmosphere environment thereby increasing the substrate surface energy and improving the adhesion of the metal barrier layer with the substrate. In one embodiment disclosed herein, a PECVD or CCVD apparatus is integrated "in-line" with a film substrate manufacturing line there for priming the substrate for metallization and/or treating the film substrate to reduce blocking before being wound into a roll.

Various embodiments of the present invention disclosed herein also comprise apparatus and methods for applying a barrier layer on to the surface of a substrate at open atmospheres. The apparatus and method disclosed herein provide for the direct combustion of liquids and/or vapors which contain the chemical precursors or reagents to be deposited on to the surface of a substrate material at open atmosphere. Metal oxides, such as aluminum oxides, are formed from the combustion of materials, such as organo-aluminum compounds with an oxidant, and combusted resulting in a vapor and/or gas at open atmosphere which is directed on to the surface of the substrate and resulting in the deposition of the desired coating thereon.

Figure 2A:
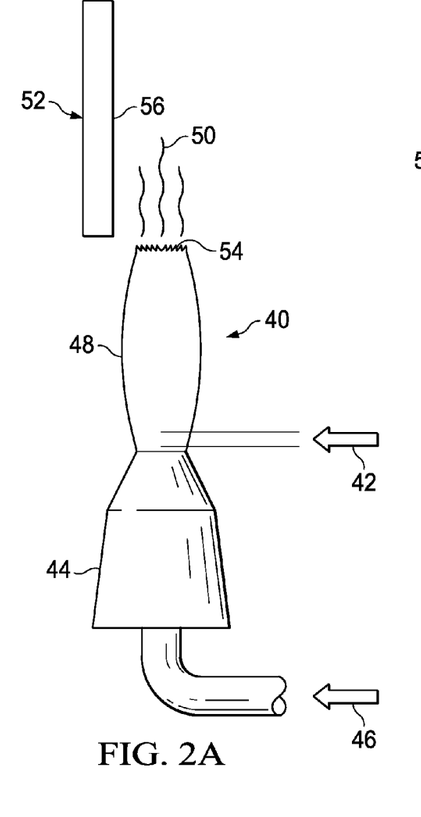
FIGS. 2A-2D depict various embodiments of the apparatus and method employed in the present invention disclosed herein.

The design and function of CCVD and equipment have been described in U.S. Pat. Nos. 5,652,021, 5,997,956 and 6,132,653, the disclosures of which are incorporated by reference herein. Turning to FIG. 2A, a general schematic of the apparatus 40 that is utilized to carry out the coating deposition process is shown. Chemical precursors 42 may comprise a solvent-reagent solution of flammable or non-flammable solvents mixed with liquid, vaporous, or gaseous reagents supplied to nozzle assembly 44 or other flame-producing device. The term "nozzle assembly" is used to refer generally to describe any apparatus that is capable of producing a flame from a fuel feed, including flame treater devices. Chemical precursors 42 are ignited in the presence of an oxidant 46 resulting in a flame 48. As the chemical precursors 42 solution or mixture burn, the reagent reacts to form an inorganic vapor and leaves the flame 48 along with other hot gases 50 and combustion products. The substrate 52 to be coated is located proximal to flame 48 within the region of gases 50.

Figure 2B:
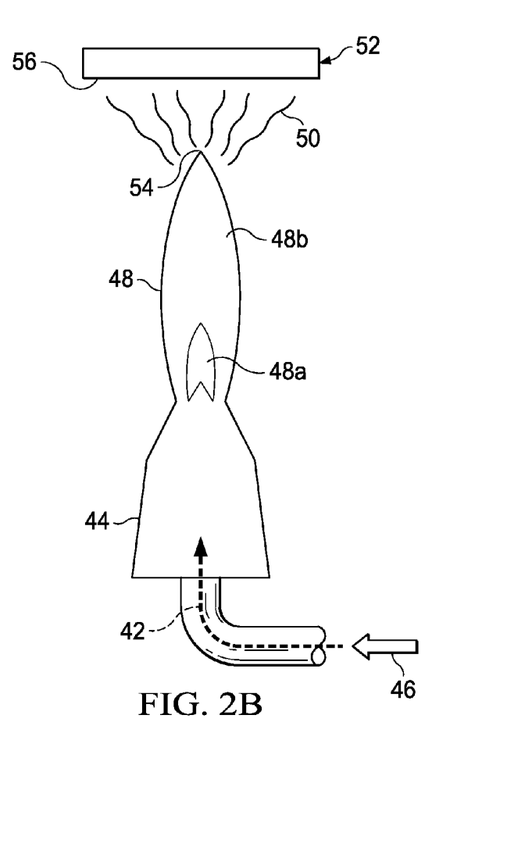

In one embodiment, substrate 52 is oriented tangentially to the flame 48, or as shown in FIG. 2B substrate 52 is oriented obliquely to the flame 48, or at any angle facing the flame end 54 of flame 48 such that the hot gases 50 containing the reagent vapor will contact the substrate surface 56 to be coated. In various embodiments, substrate 52 may consist of a film or composite film comprising oriented polypropylene (OPP), polyethylene (PE), polylactic acid (PLA), polyhydroxy-alkanoate (PHA), Polyethylene Terephthalate (PETP), other polyesters, or other known polymer, bio-polymer, paper or other cellulosic substrates, alone or in combination, as known in the art.

FIG. 2B is similar to the apparatus 40 shown in FIG. 2A, but is configured for a non-turbulent flame methodology, suitable for chemical precursors comprising gaseous precursors 42 and non-flammable carrier solutions 46. Flame 48 produced by the nozzle assembly 44a typically has the flame characteristics of an inner flame 48a defining the reducing region where the majority of oxidizing gas supplied with the reagent burns and an outer flame 48b defining the oxidizing region where the excess fuel oxidizes with any oxidizing gas in the atmosphere. In this example embodiment, the substrate is positioned at an oblique angle to the flame end 54 of the flame 48 such that the hot gases and/or vapors 50 containing the reagent vapor will contact the substrate surface 56 of substrate 52.

Referring back to FIG. 2A, the precursor mixture 46 is supplied to the nozzle assembly 44. Oxidant 46 is also supplied to the nozzle assembly 44 in some fashion, via a separate feed, or is present in the process atmosphere, or the oxidant may be supplied by a separate feed to the process atmosphere or flame ignition point, or the oxidant may be present in the reagent mixture. In the depicted embodiment, the chemical precursor solution 42 is ignited in the presence of oxidant 46 and combust in flame 48 resulting in the generation of heat, gases and/or vapors 50. The generation of heat causes any liquid reagent solutions present to vaporize and increase the temperature of the substrate 52 so as to result in improved surface diffusion of the coating resulting in a more uniform coating deposited on to the substrate surface 56.

In performing CCVD or PECVD coating deposition on film substrates, certain deposition conditions are preferred. First, the substrate needs to be located in a zone such that it is heated by the flame's radiant energy and the hot gases produced by the flame sufficiently to allow surface diffusion. This temperature zone is present from about the middle of the flame to some distance beyond the flame's end. The temperature of the flame can be controlled to some extent by varying the oxidant-to-fuel ratio as well as by adding non-reactive gases to the feed gas or non-combustible miscible liquids to the feed solution. Secondly, the metal-based precursors need to be vaporized and chemically changed into the desired state. For oxides, this will occur in the flame if sufficient oxygen is present. The high temperatures, radiant energy (infrared, ultraviolet and other radiant energy), and plasma of the flame also aid in the reactivity of precursors. Finally, for single crystal films, the material being deposited should be in the vapor phase, with little or no stable particle deposition. Particle formation can be suppressed by maintaining a low concentration of solutes, and by minimizing the distance, and therefore time, between locations where the reagents react and where the substrate is positioned. Combining these different factors predicts the best deposition zone to be located in proximity of the flame's tip. If a solution is sprayed, droplets can strike a substrate located too far into the flame, possibly resulting in some spray pyrolysis characteristics in the resulting film. In fact, in some configurations, with large droplets or with some reactants, it may be impossible to not have some spray pyrolysis occur.

In one embodiment of the invention disclosed herein, a plasma torch may also be used in a manner similar to a flame apparatus to achieve similar results. Chemical precursors are sprayed through a plasma torch and deposited on to the substrate. The reagents and other matter fed through the plasma torch are heated and, in turn, heat the substrate surface, much in the same manner by the flame embodiment described herein. In plasma enhanced chemical vapor deposition (PECVD), lower plasma temperatures may be used as compared to conventional plasma spraying, as lower heat is required to cause the chemical precursors to react. As a result, the chemical precursor reactions occur at lower temperatures thereby allowing substrates with low melt points to take advantage of PECVD. The deposition of the coating on to the substrate results from directing of the plasma gas vapor containing the charged ions in the direction of the substrate. For example, a chemical precursor gas mixture or solution is fed into a plasma flame resulting in the formation of a chemical vapor. The chemical precursor solution may comprise inorganic metal oxides such as aluminum oxide or silicon oxide. Once oxidized, the resulting ions in substantially vapor form are directed onto the surface of the substrate resulting in the formation of a solid coating formed on the surface of the substrate and which are typically formed with thicknesses in the 1 to 50 nanometer range.

In general, as long as a flame is produced, CCVD can occur, generally independent of the flame temperature, or substrate surface temperature. The flame temperature is dependent on the type and quantity of reagent, solvent, fuel and oxidant used, and the substrate shape and material, and can be determined by one skilled in the art when presented with the particular reagent, solvent, fuel, oxidant and other components and conditions for deposition. The preferred flame temperature near the deposition surface on a moving web line is between about 800° C. and 1300° C. As flames can exist over a wide pressure range, CCVD can be accomplished at a pressure from about 10 torr to about thousands of torr, but it is preferred to be at ambient pressure to ease its use on the polymer film processing line. Likewise, if plasma is formed for depositing the coating, the temperature of the plasma can range from about 400° C. to about 1200° C. The temperature of the substrate during the CCVD process also can vary depending on the type of coating desired, the substrate material, and the flame characteristics. Generally, a substrate surface temperature of between about 40° C. and 70° C. is preferred for temperature sensitive polymer films.

The deposition rate of the coating onto the substrate can vary widely depending on, among other factors, the coating quality, the coating thickness, the reagent, the substrate material and the flame characteristics. For example, longer coating times can result in thicker coatings, assuming a relatively constant feed flow rate to the flame, less porous coatings, assuming a relatively lower feed flow rate to the flame, or more porous or columnar coatings, assuming a relatively greater feed flow rate to the flame. Likewise, if a higher quality coating is desired, a longer coating time at a lower feed flow rate may be necessary, while a gross or textured coating can be produced relatively quickly using a greater precursor feed flow rate. One skilled in the art can determine the feed flow rates and deposition times necessary to produce a desired coating. Typical deposition rates of the nanocoated product made using the apparatus and methods disclosed herein range from about 10 nm/min to about 1000 nm/min with the film surface being normally coated for 0.1 to 10 seconds.

As discussed above, the chemical precursor solution in one embodiment is a liquid reagent dissolved in a liquid solvent. However, solid, liquid, vaporous and gaseous reagents can be used, with a liquid or gaseous solvent, as long as the chemical precursor feed to the flame is typically liquid or gaseous in nature.

Figure 2C:
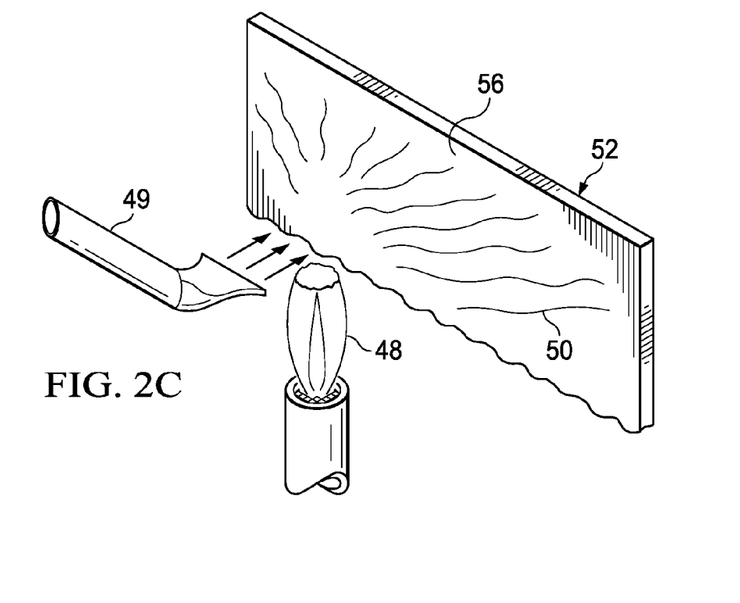

Referring to FIG. 2C, one embodiment of the invention disclosed herein is shown wherein a flame redirect source is shown to reduce the temperature of the. The flame redirect technique employs an air knife 49 situated at an angle to the flame 48 to redirect the gases and/or vapors 50 from the process. The air knife 49 directs an air stream into the vapor stream 50 coming from the flame 48. This effectively redirects the vapor stream 50 in the desired direction of the substrate surface 56 while at the same time deflecting the heat stream associated with flame 48 from overheating or melting the substrate 52 being coated with the vapor 50. This method results in the dissipation of heat directed on to the substrate 52 from the flame 48 heat stream thereby resulting in the deposition of desired coating on to the substrate surface 56 at lower temperatures. The redirect flame embodiment also acts to disperse the gas and/or vapor stream 50 emanating from the flame 48 resulting in a wider deposition stream 50 being directed on to the substrate surface 56 and enlarging the coating area of same. In an alternative embodiment, an electromagnetic or "electro-redirect" method may be employed to redirect the deposition of ions and/or particles emanating from a flame and/or plasma source on to the substrate surface. In this embodiment, the flame and/or plasma source initially directs the ion and/or particle stream and any associated heat in a substantially parallel direction to the film substrate to be coated. A field with an electrical potential is generated by means as is known in the art which passes through a portion of the film substrate resulting in the redirection and/or acceleration of the ion and/or particle stream emanating from the flame or plasma source on to the film surface. The chemical bonds within the polymer molecules are more readily broken which results in the rapid formation of free radicals. This results in the deposition of the desired nanocoating on to the film surface without the associated heat being transferred to the film surface thereby preventing potential melting of the film substrate during the deposition process.

Figure 2D:
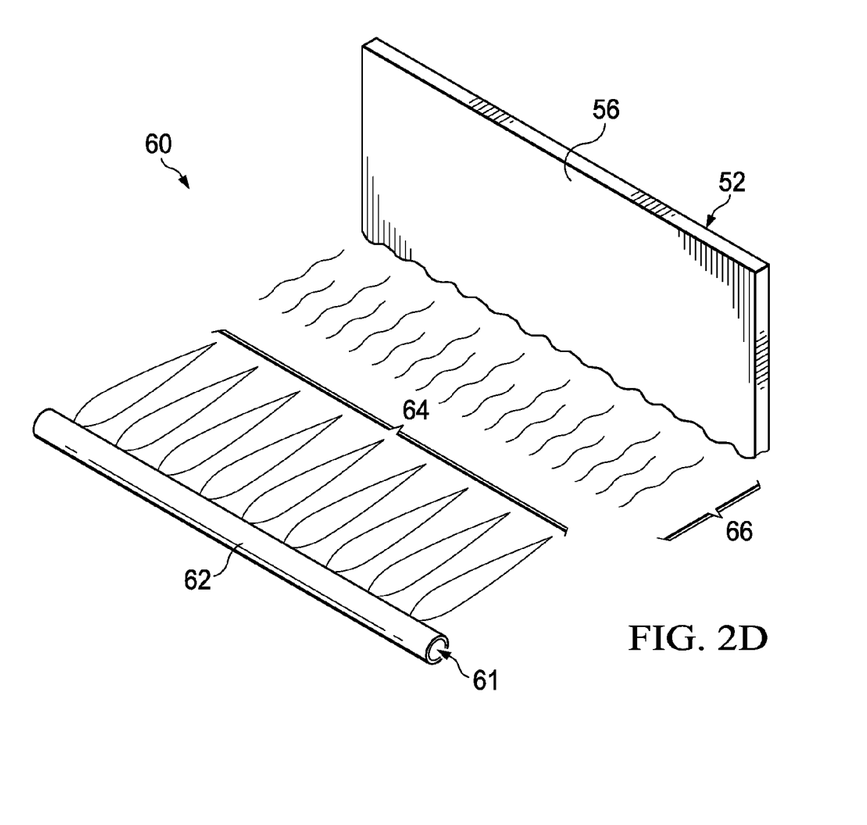

With reference to FIG. 2D, one embodiment of the invention disclosed herein is shown with a multi-flame head assembly 60 which can act in a way similar to a flame treater to provide for a long flame zone of determined length which can process the desired width of substrate that moves past the length of the flame. The long axis of the flame is equated to the width of the material passing by to receive the nanocoating. In this embodiment, the multi-flame head assembly 60 includes a flame nozzle assembly 62 comprising a pipe with spaced holes or nozzles thereon. Chemical precursors 61, which may also include an oxidant, are fed into flame nozzle assembly 62 and, when ignited, result in flame bank 64 or linear flame and the generation of hot gases and/or vapors 66. The substrate 52 to be coated is located proximal to flame bank 64 within the region of hot gases and/or vapors 66, such that hot gases and/or vapors 66 containing the reagent vapor will contact the substrate surface 56 resulting in a coating deposited thereon. The flame treater or multi-head flame assembly 60 improves the continuity and thickness of coating deposition across the substrate surface 56 as the hot gas and/or vapor region 66 is expanded by the use of multiple flame sources. The multi-flame head assembly 60 depicted in FIG. 2D is shown with flame nozzle assembly 62 aligned with nozzle holes positioned in a planar, liner orientation. However, other embodiments are contemplated wherein multiple flame heads or flame nozzle assemblies may be designed in various two-dimensional and three-dimensional geometries such as square, rhomboid, cylindrical shapes which may be fashioned and positioned relative to the film being processed according to the necessity of the user. Industrial flame treater can function well at yielding the desired nanocoating. Therefore, the embodiment depicted in FIG. 2D is not to be construed as limiting to the disclosure herein.

Figure 3A:
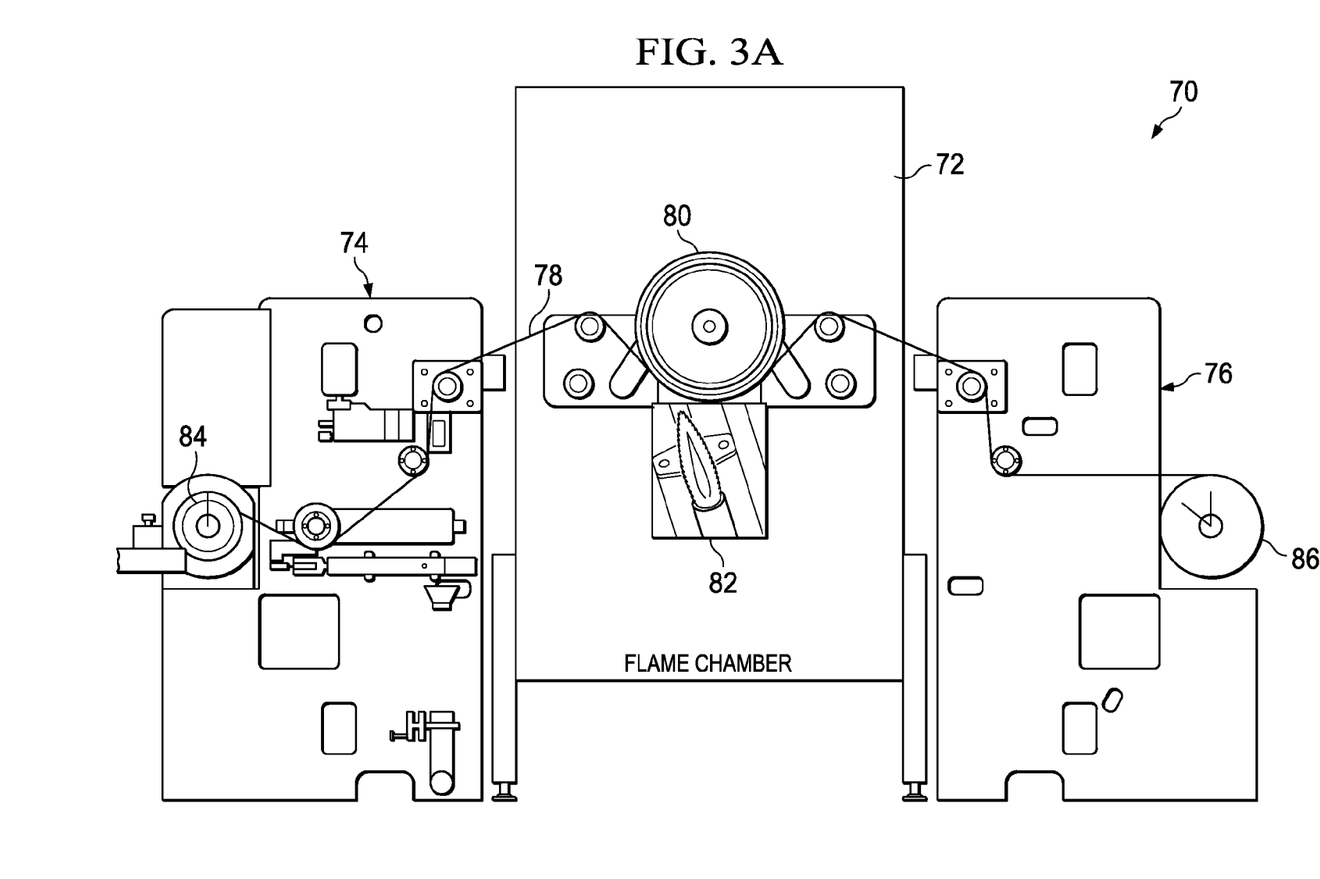
FIGS. 3A-3B are depictions of the apparatus and method as integrated into in-line substrate film production and manufacturing equipment according to one embodiment of the invention disclosed herein; and, FIG. 4 is a cross-sectional depiction of a film substrate with multiple coating nanolayers according to one embodiment of the invention disclosed herein.

Turning to FIG. 3A, one embodiment of a CCVD and/or PECVD assembly as described herein is shown "in-line" with a roll-to-roll winding/coating assembly 70 in a typical manufacturing context. In the depicted embodiment, an unwinding unit 76 unwinds film 78 from roller 86 as winding unit 74 winds film 78 on to winding core 84. A flame chamber 72 housing a CCVD and/or PECVD coating assembly 82 as described herein is integrated in-line with the unwinding/winding units 76 and 74. The flame chamber 72 constitutes an unpressurized enclosure in which CCVD and/or PECVD assembly 82 is housed for the safety of the user and surrounding equipment and minimization of impurities from outside materials. During the unwinding/winding process, a film substrate 78 is drawn from unwinding unit 76 through various rollers and on to drum 80. After receiving a coating and exiting the nanocoating deposition chamber 72, film substrate 78 is wound around winding core 84. Drum roller 80 rotates and winds and/or draws substrate 78 in proximity to the hot gases and/or vapors generated by the flame assembly 82. In the depicted embodiment, drum roller 80 is positioned above flame assembly 82 so as to maximize the surface area contact between the rising hot gases and/or vapors generated by flame assembly 82 thereby resulting in efficient deposition of the coating material carried by the hot gases and/or vapors on to substrate 78. In various contemplated embodiments, drum roller 80 may comprise a temperature control roll so as to impart a thermal temperature to the substrate and a differential between the substrate 78 to be coated and the heat generated by the flame assembly 82 which would facilitate coating substrates with low melt points without heat damage to the substrate according the inventive method and apparatus disclosed herein.

The metallization primer process described herein may be conducted either during ("in-line") or after film manufacturing. The film surface manufacture in-line is commonly pristine and free of contaminants thereby making it ideal for surface priming due to the challenges of keeping the film surface clean after the manufacturing process is complete. For example, dust, anti-block particles, or additives in the polymer film may "bloom" to the surface of the film substrate in a post-manufacturing environment. These conditions can make it difficult to achieve a uniform primer coating during the priming process conducted after the film has been manufactured and stored for a period of time. Blooming additives can also migrate over the inorganic nanolayer, as it is not a barrier layer in itself, thus it is desired not to have these additives in the film.

Figure 3B:
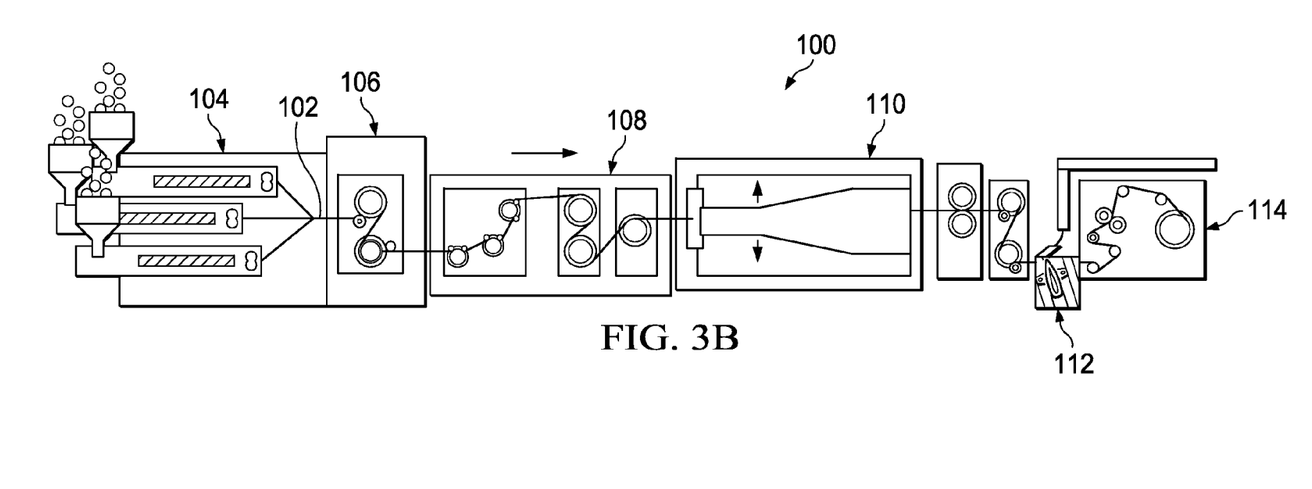

Turning to FIG. 3B, one embodiment of the invention disclosed herein is shown wherein a flame CCVD or PECVD unit is installed in-line with a biaxial film substrate production line 100. In the depicted embodiment, a biaxial film substrate 102 is formed by an extrusion unit 104. The extrusion unit 104 has multiple feed paths so as to produce a film composed of compositional layer variations that are melt extruded together forming a primary multilayered film. The film substrate 102 is then passed through a cooling unit 106 and is stretched in the machine (longitudinal) direction in machine stretching unit 108 and in the transverse direction in transverse stretching unit 110. The film substrate is then passed through the flame assembly 112 wherein it is coated with the desired inorganic primer, anti-block nanolayer and/or barrier coating according to the apparatus and processes described herein. The coated film substrate is then wound into a transportable roll in winding unit 114 for further processing or distribution. The resulting film coating includes an inorganic surface nanolayer which terminates the polymer network so that it will not cross link with its self or block when rolled into a multi-layered wound roll or stacked in a sheet configuration in typical manufacturing storage conditions.

It should be noted that the embodiments shown in FIGS. 3A and 3B may utilize plasma-enhanced chemical vapor deposition (PECVD) apparatus and methods to accomplish the coating process as described herein. As such, the depicted embodiments are not be construed as being limited to "flame" CCVD methods. The plasma may be manipulated by an electromagnetic field in proximity to the plasma source so as to direct the ions generated from the plasma reaction on to the substrate surface to be coated. Thus CCVD is not limiting to the product made, but is just one enabling method used to accomplish making of the described product on the original film fabrication line.

Figure 4:
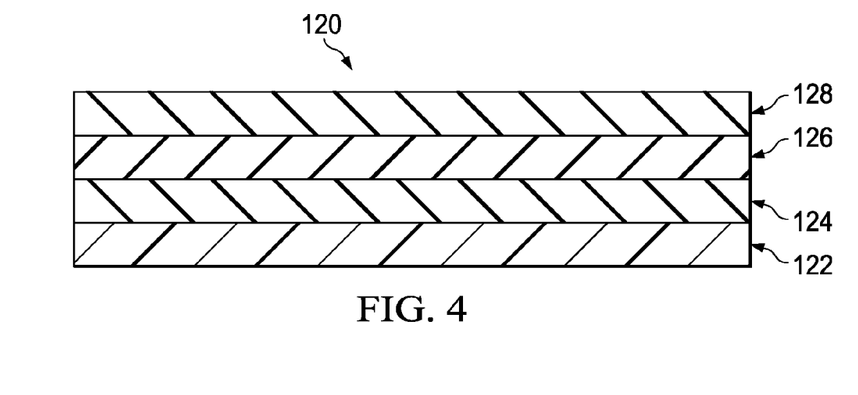

FIG. 4 is a structural diagram depicting an embodiment of a coated substrate 120. In the depicted embodiment, a film or paper substrate 122 is primed with a pure or substantially pure silica layer 124. The substrate 122 with silica layer 124 is then coated with additional oxide layer 126 and a subsequent metal or oxide layer 128. Oxide layers 126, 128 may be comprised of silica mixed with an additional chemical additive or "dopant" for purposes of enhancing the reactivity of the primed surface 124 with additional desired coatings. In one embodiment, the metal barrier layer deposited by the apparatus and method described herein has a thickness between 5 and 50 nm, with an optical density of over 30%. The metal barrier layer may comprise aluminum, copper, iron, manganese, zinc and/or other metals as dictated by the needs of the user. In other embodiments, layer 128 is an oxide layer deposited via CCVD or layer 128 is a metal layer deposited by conventional vacuum metallization technology.

To describe certain embodiments of the inventive apparatus and methods disclosed herein, the following examples are provided. Once having understood the examples set forth herein, one of ordinary skill in the art should be able to apply the apparatus and methods disclosed herein to other chemical deposition methods, and such applications are deemed to fall within the scope of the invention disclosed herein. The following examples are for illustrative purposes and are not to be construed as limiting the scope of the invention. In the examples, the primer coating deposition was performed using CCVD in an atmospheric environment. Unsealed shrouds and local ventilation to exhaust combustion residual gas were used in all cases. The chemical precursors consisted of TEOS in a methane air feed through a film flame treater with a flame temps of 800 to 1200C.

Example 1

In-line Flame Treatment of Oriented Polypropylene Film

In one example, polypropylene film was extruded and oriented on a film production line. The film at 70 gauge total thickness (18 μm thickness) was composed of a skin layer of Total Petrochemical 8573 polypropylene, a core of Total Petrochemical 3371 polypropylene, and an opposing skin layer of Total Petrochemical 3371 polypropylene. Flame treatment was performed on the 8573 skin layer prior to final winding of the extruded and oriented film. This film demonstrates the slight improvement in metallization performance from flame treating alone.

Flame treatment was performed with a 2-foot section of a 424-HCW-15/6 Ft burner from Ensign Ribbon Burner. Air for the flame was controlled by a King Instruments 7530 rotameter at about 2 cfm. An Alicat Scientific mass flow controller (model MC-10SLPM) metered methane flow for the flame. Methane for the flame was flowed at setting of 8.3 SLPM. The methane stream was mixed with the air stream prior to entering the burner and was thereafter combusted.

The polypropylene film exited the transverse orientation at a line speed of approximately 80 feet/min and passed over a chill drum maintained at 45° C. The burner was positioned at bottom dead center of the drum, flame oriented upward, with a gap of 5 mm between the burner face and the drum surface. The flame gases were exhausted through a rectangular channel approximately 16" in length, 2 feet in width, and 1" in height. The channel was positioned directly downstream of the burner and was designed such that the film itself formed the upper wall of the channel. This allowed for increased contact time between the hot flame vapors and the film surface.

The film was then wound for later use, in this case for conventional vacuum metallization. The flame-treated 8573 surface of the film was metalized with aluminum metal to a minimum optical density of 2.3. Oxygen transmission of the metalized film was tested at 23° C. with dry oxygen, and resulted in an oxygen transmission rate (OTR) of 1801 cc/(m$^2$-day). Water vapor transmission rates (WVTR) were tested at 38° C. and 90% relative humidity and resulted in a water vapor transmission rate of 6.09 g/(m$^2$-day).

In comparison, Tock, Richard W., "Permeabilities and Water Vapor Transmission Rates for Commercial Films," *Advances In Polymer Technology*, Vol. 3, Issue 3, pp. 223-231, Fall (1983), lists oriented polypropylene film with an oxygen transmission rate of 2092 cc-mil/(m$^2$-day) [listed as 135 cc-mil/(m$^2$-day-atm)] and which is equivalent to 2988 cc/(m$^2$-day) for the 70 gauge films employed in this example. Tock lists oriented polypropylene film with a water vapor transmission rate of 5.1 g-mil/(m$^2$-day) [listed as 0.33 g-mil/(m$^2$-day-atm)], which is equivalent to 7.3 g/(m$^2$-day) for the 70 gauge films employed in this example. The non-flame treated, bare oriented polypropylene (OPP) films at 70 gauge exhibited an OTR >2,000 cc/(m$^2$-day), which is beyond the testing limits of the MOCON Oxtran. The same bare OPP films exhibited a WVTR of 8.14 g/(m$^2$-day), which is in approximate agreement with Tock's data. Flame treatment and metallization yields a 40% improvement in oxygen barrier (reduction of OTR) based on Tock's data and a 25% improvement in moisture barrier (reduction in WVTR) compared to the measurements on the bare OPP film.

Example 2

Online Deposition of SiO$_2$-Based Metallization Primer on to Oriented Polypropylene Film For comparative purposes, online flame deposition of silica (CCVD) was performed on to the 8573 skin layer of the same 8573/3371/3371 oriented polypropylene film as from Example 1 at the same 70 gauge total film thickness (18 μm thickness). The equipment was identical as described in Example 1 with the sole exception of an additional mass flow controller and bubbler that were used to introduce the silica precursor. The silica deposition and flame treatment were applied on the 8573 skin side same as Example 1. Air for the flame was delivered at 2 cfm. Two Alicat Scientific mass flow controllers, both model MC-10SLPM, metered methane flows for the flame. Primary methane for the flame was metered at 6.9 SLPM and gas entering the precursor bubbler had a methane flow setting of 1.4 SLPM. The bubbler methane gas stream flowed in to a heated bubbler containing tetraethoxysilane (TEOS, 98%, Aldrich) acting as the silica precursor. The bubbler was heated to 40° C. so as to provide appropriate vapor pressure and the line exiting the bubbler was heated to 45° C. in order to prevent condensation of the TEOS vapor. The bubbler methane, bypass methane and air gas streams were mixed prior to combustion and combusted at the burner exit.

The polypropylene film exited transverse orientation at a line speed of approximately 80 feet/min and passed over a chill drum maintained at 45° C. The burner was positioned at bottom dead center of the drum, flame oriented upward, with a gap of 5 mm between the burner face and the drum surface. The flame gases were exhausted through the same rectangular channel as from Example 1.

The coated film was wound and shipped for conventional vacuum metallization. The silica-coated surface of the film was metalized with aluminum metal to a minimum optical density of 2.3. Oxygen transmission of the metalized film was tested at 23° C. with dry oxygen, and resulted in a transmission rate of 63.1 cc/(m$^2$-day). Water vapor transmission was tested at 38° C. and 90% relative humidity and resulted in a water vapor transmission rate of 1.80 g/(m$^2$-day).

Silica deposition and metallization of OPP film yields a 98% improvement in oxygen barrier (reduction of OTR) based on Tock's data in Example 1 and a 78% improvement in moisture barrier (reduction in WVTR) compared to the measurements on the bare OPP from Example 1. There is also significant improvement in barrier over Example 1 which had identical flame conditions other than silica being deposited.

Example 3

Metallization Layer on Liquid Fuel Flame Treated PLA Polymer by Roll Coater

As an example and for comparative purposes, a biaxially oriented PLA polymer film substrate was flame treated first on the inside surface of the roll. The following typical processing conditions were used for the liquid fuel sourced flame, which atomized liquid flown through it into submicron droplets. A combustible solvent containing toluene or alcohol based solvent at a flow rate of 4 mL/min was flown through an atomizer. Next, the atomized solvent was burned into a flame in proximity of the polymer substrate. The polymer film surface was flame treated for 3 laps at a flame gas temperature at its surface of 550° C., a motion speed of 2000 inch/min, and a step size of 0.25 inch. Next, an Al metallization layer was then deposited on top of the flame treated surface by thermal evaporation. OTR was tested at 23° C. and 100% dry oxygen. An OTR of 7.18 cc/m$^2$·day was obtained, which is a significant improvement compared to bare biaxially oriented PLA polymer with an OTR of over 350 cc/m$^2$·day and Al metalized bare biaxially oriented PLA polymer on the inside surface of the roll with an OTR of over 14.09 cc/m$^2$·day.

Example 4

Liquid Fueled CCVD SiO$_2$ Metallization Primer Layer in a Fume Hood on PLA Polymer As an example to liquid fuel deposit a SiO$_2$ based primer nanocoating interface layer on to the biaxially oriented PLA polymer substrate for metallization, the following typical processing conditions were used. A CCVD deposition solution containing combustible solvent and TEOS precursor at a concentration of 9.0 mM was flown at a flow rate of 4 mL/min through the atomizer energized to yield sub-micron sized droplets. The atomized solution was burned into a flame in front of the polymer film substrate. Next, the SiO$_2$ based nanocoating was deposited for 2 laps at a gas temperature at the surface of 400° C., a motion speed of 1000 inch/min, and a step size of 0.25 inch. Before SiO$_2$ deposition, the PLA polymer film substrate was flame treated for 1 lap at the same conditions, except no silica precursor. An Al metallization layer was then deposited on top of the SiO$_2$ interface layer by thermal evaporation. OTR was tested at 23° C. and 100% dry oxygen. An OTR of 2.78 cc/m$^2$·day was obtained, which is a significant improvement compared to Al metalized bare biaxially oriented PLA polymer with an OTR of over 350 cc/m$^2$·day, Al metalized biaxially oriented PLA polymer on the inside surface of the roll with an OTR of 14.09 cc/m$^2$·day, and flame treated biaxially oriented PLA polymer on the inside surface of the roll with an OTR of 7.18 cc/m$^2$·day.

Example 5

CCVD SiO$_2$ Based Metallization Primer Layer in a Fume Hood on OPP Polymer

As an example for subsequent to winding SiO$_2$ based metallization primer layer on the OPP polymer made on the same line as Examples 1 and 2, the following typical deposition conditions were used for the linear flame burner head with a length of 12" and a width of 0.75" in the fume hood onto Total Petrochemical polypropylene. The burner head is manufactured by Flynn Burner Corporation (model No. T-534). Methane was flown at about 0.67L/min through a bubbler, containing TEOS precursor at a temperature of 40° C. and a methane bypass line at about 13.8 L/min. Then the methane flowing through the bypass line was mixed with air at a flow rate of about 4.2 slpm. The air/methane mixture along with the methane containing TEOS precursor were flown through the linear burner and formed flame near the polymer substrate. Then SiO$_2$ interface layer was deposited onto the polymer surface for 1 lap at a distance of 37 mm, with a flame temperature of 1122° C. measured near the burner, and a motion speed of 184 ft/min. Al metallization layer (70 nm measured by the crystal sensor) was then deposited on top of the SiO$_2$ interface layer by e-beam evaporation. OTR was tested at 23° C. and 100% dry oxygen. An OTR of 43.35 cc/m$^2$·day was obtained (AAT-03D1), which is a significant improvement compared to bare OPP polymer with an OTR of over 1000 cc/m$^2$·day. WVTR was also tested at 38° C. and 89% RH a WVTR of 0.35 g/m$^2$·day was obtained compared to bare OPP polymer with a WVTR of 9.3 g/m$^2$·day.

Example 6

Flame Treated Surface with CCVD SiO$_2$ Based Metallization Primer Layer in a Fume Hood on OPP Polymer As an example for flame treating polymer substrate before SiO$_2$ deposition, the system, substrate and conditions were the same as Example 5. The difference is the 9"×12" OPP polymer substrate was first flame treated for 1 lap at a methane flow of 13.8 L/min, an air flow of 4.2 slpm, a burner-sample distance of 39 mm, a motion speed of 184 ft/min, and a temperature of 1180° C. Then the flame treated polymer was deposited for 2 laps of SiO$_2$ at a flame temperature of about 1190° C., a motion speed of 184 ft/min, and a burner-sample distance of 39 mm. The following typical processing conditions were used for the SiO$_2$ deposition using the linear flame burner head with a length of 12" and a width of 0.75" in the fume hood. The burner head is manufactured by Flynn Burner Corp. (model No. T-534 burner). Methane was flown at about 0.2 L/min through a bubbler, containing TEOS precursor at a temperature of 40° C. and a methane bypass line of about 13.8 L/min. Then the methane flowing through the bypass was mixed with air at a flow rate of about 4.2 slpm. The air/methane mixture along with the methane containing TEOS were flown through the linear burner and formed flame near the polymer substrate. Al metallization layer was then deposited on top of the SiO$_2$ interface layer by e-beam evaporation. OTR was tested at 23° C. and 100% dry oxygen. An OTR of 4.44 cc/m$^2$·day was obtained (AAT06C), which is a significant improvement compared to bare OPP polymer with an OTR of over 1000 cc/m$^2$·day. WVTR was also tested at 38° C. and 89% RH. A WVTR of 0.10 g/m$^2$·day was obtained compare to bare OPP polymer with a WVTR of 9.3 g/m$^2$·day.

Example 7

In-Line Silica Primer Coating with Flame Redirect

In this example, experiments for depositing a silica primer coating via CCVD were conducted in-line on a pilot biaxial orientation film line with a flame redirect configuration as shown in FIG. 3B. A shield was installed to direct reactive plasma generated by the flame assemblies to keep the reactive plasma in relative proximity to the film substrate surface. An extended deposition box was located at end of the shield to expose the films surface to the deposition gasses for longer time. Beyond the deposition zone the gasses were exhausted away.

Both OPP and PLA films were produced and coated with silica in an in-line production context according to the inventive disclosure herein. The OPP film comprised a core layer of Total 3371 homopolymer polypropylene and skin layers of Total 8573 random copolymer polypropylene. The structure of the PLA film included a metallization surface of Nature Works 4043 (~5% crystalline), a core of Nature Works 4032 (~40% crystalline), and a sealant layer of Nature Works 4060 (amorphous PLA) with anti-block. The film substrates were then metalized using conventional vacuum metallization techniques. Both OPP and PLA films were metalized to an optical density of 2.3±0.2. This optical density was selected as the minimum barrier performance standard to achieve functional barrier and to highlight differences in the effectiveness of metallization primers. As shown in Table 1 below, the OPP and PLA films treated with silica using the CCVD method exhibited improved metal deposition characteristics resulting in improved barrier performance.

TABLE 1

| Sample ID | Structure | WVTR cc/(m²/day) (38° C./90% RH) | OTR g/(m²/day) |
|---|---|---|---|
| PT031611-30 | OPP-metalized | 7.2 | >2000 |
| PT031611-23 | OPP-silica-metalized | 2.1 | 56.0 |
| PT111110-01 | PLA-metalized | 67.6 | 209.0 |
| PT111110-05 | PLA-silica-metalized | 1.6 | 11.8 |

Treating the film with a corona discharge before or after the metallization primer method described herein may also enhance the properties of the coating. Conventional flame and corona discharge treatments are typically employed to partially oxidize the surfaces, particularly PE and PP, to allow for better adhesion of tie layers, inks, coatings, and to prepare the coextruded polymer skins for metallization. This can remove surface contaminates such as oils or other species that may disrupt a direct bound of the inorganic nanolayer of the present invention to the polymer film material. Example 6 shows the potential enhanced results from treating the surface prior to coating.

To determine the approximate thickness XRF and XPS were used. XRF sensitive to films 10's of nanometers thick. When used to try and detect the thickness of the above examples silica, the thickness was below the detection limit. XPS was then tried, and it being very surface sensitive could detect the silica. To correlate the silica thickness to known thickness of silica on the same polymer, e-beam deposition of silica was done with a quartz crystal monitor. Denton Explorer—E-beam Evaporator was used for deposition. The process was run at $2*10^{-6}$ Ton and 0.3 A/S. The silica was grown to 4, 6 and 8 nm thickness, and the corresponding XPS silica/oxygen peaks in thousands of counts per second (TCPS) were 87/456, 109/494 and 133/614. The XPS Si/O peaks for bare OPP were <1/<1 TCPS. One can see that the trend is not linear with a zero intercept but does increase with silica. The sample of Example 2 was analyzed with XPS in two different location on the silica coated section of the film web with Si/O peaks of 14/106 and 7/56 TCPS. Example 6 resulted in XPS measured result of 1.3/46 TCPS. The results show that the layer deposited is significantly less than the 4, 6 and 8nm e-beam silica and most likely even less than 2 nm. These are not absolute thicknesses and the XPS results are not linear, but one can be comfortable that the layer can function very well at less than 4 nm thickness and even below 2 nm thickness. In examples 1 and 2 the flame treatment and the silica coated areas were across the center 2 feet of a film about 3 feet wide, and the metallization in these center sections were better than the untreated outer section. The less than 2 nm silica coated substrate of Example 2 had a larger change in the appearance to untreated than the just flame treated Example 1 between. This shows that a very thin layer is all that is required to enhanced wetting and subsequent processing improvements.

In the attempts of above 8 nm in average silica thickness deposited in just one or two flame treater CCVD passes, the barrier results decreased. It is believed this is due to growing a less dense film that has a nanostructured surface. This nanorough surface can inhibit metallization from being as dense and continuous, which can reduce the barrier. Thus it is preferred that the layer is less than 8 nm and more preferred it is less than 4 nm average thickness. A few atoms layer is theoretically all that should be needed to inhibit layer to layer welding, so 2 nm or less can provide the desired effects for many applications. No welding of the silica coated rolls has occurred, and this is true of many rolls with no slip or anti-block materials. This thinness reduces cost and can be formed with high coverage and smooth texture with just one or a small number of deposition systems in sequence even on high speed lines.

Unless otherwise indicated, all numbers expressing quantities of ingredients, properties such as molecular weight, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques.

While the invention has been particularly shown and described with reference to a preferred embodiment, it will be understood by those skilled in the art that various changes in form and detail may be made therein without departing from the spirit and scope of the invention.

What is claimed is:
1. A method comprising:
   a) forming a coextruded organic film substrate by a co-extrusion process;
   b) depositing a first inorganic nanocoating layer directly on to a surface of the film substrate at open atmosphere to enhance the wettability of the film substrate for metallization, wherein the first inorganic nanocoating layer is silica, and wherein the inorganic nanocoating layer is deposited on to at least one surface of the film substrate prior to all winding and deposited in a process that is inline with the coextrusion process, wherein the inorganic nanocoating layer is less than 8 nm in average thickness; and wherein the surface roughness of the inorganic nanocoating layer is characterized by root mean square value of less than about 5 nm; and
   c) depositing a metal layer directly on the first inorganic nanocoating layer by a vacuum metallization process to produce a coated film substrate, wherein the metal layer is not a metal oxide layer, wherein the metal layer is aluminum, and wherein the metal layer has a thickness from about 5 to about 50 nm.

2. The method of claim 1 wherein the inorganic nanocoating layer is deposited on to at least one surface of the film substrate by combustion chemical vapor deposition.

3. The method of claim 1 wherein the inorganic nanocoating layer is deposited on to at least one surface of the film substrate by plasma enhanced chemical vapor deposition.

4. The method of claim 1 wherein the inorganic nanocoating layer is substantially deposited by redirection of a flame.

5. The method of claim 1 wherein the inorganic nanocoating layer is substantially deposited by electro-redirection of a plasma field.

6. The method of claim 1 wherein the film substrate is a cast, monoaxially, or biaxially oriented cast film.

7. The method of claim 1 wherein the film substrate is a blown film.

8. The method of claim 1 wherein the film substrate is a biaxial film.

9. The method of claim 1 wherein the film substrate is a bio-based polymer film.

10. The method of claim 1 wherein the film substrate comprises a core polymer layer selected from the group consisting of polyethylene, polypropylene, polystyrene, polylactic acid, polyethylene terephthalate, polyesters, and copolymers thereof and mixtures thereof.

11. The method of claim 1 wherein the coated film substrate has a moisture vapor transmission rate of 2.0 g/m2/day or less.

12. The method of claim 1 wherein the coated film substrate has an oxygen transmission rate of 10 cc/m$^2$·day or less.

13. The method of claim 1 wherein at least one additional inorganic nanocoating layer is applied to form a transparent barrier layer.

14. The method of claim 1, wherein between the depositing a first inorganic nanocoating layer step and the depositing a metal layer step, the coated film substrate is wound.

15. A method comprising:
  a) forming a coextruded organic film substrate by a coextrusion process;
  b) depositing a first inorganic nanocoating layer directly on to a surface of the film substrate at open atmosphere to substantially inhibit blocking of the film substrate, wherein the first inorganic nanocoating layer is silica, and wherein the inorganic nanocoating layer is deposited on to at least one surface of the film substrate prior to all winding and deposited in a process that is inline with the coextrusion process, wherein the inorganic nanocoating layer is less than 8 nm in average thickness; and wherein the surface roughness of the inorganic nanocoating layer is characterized by a root mean square value of less than about 5 nm; and
  c) depositing a metal layer directly on the first inorganic nanocoating layer by a vacuum metallization process, wherein the metal layer is not a metal oxide layer, wherein the metal layer is aluminum, and wherein the metal layer has a thickness from about 5 to about 50 nm.

16. The method of claim 15 wherein the inorganic nanocoating layer is deposited on to at least one surface of the film substrate by combustion chemical vapor deposition.

17. The method of claim 15 wherein the inorganic nanocoating layer is substantially deposited on to at least one surface of the film substrate by plasma enhanced chemical vapor deposition.

18. The method of claim 15 wherein the inorganic nanocoating layer is substantially deposited by redirection of a flame.

19. The method of claim 15 wherein the inorganic nanocoating layer is substantially deposited by electro-redirection of a plasma field.

20. The method of claim 15 wherein the inorganic nanocoating layer is substantially deposited on to at least one surface of the film substrate prior to lamination.

21. The method of claim 15 wherein the film substrate is a cast, monoaxially, or biaxially oriented cast film.

22. The method of claim 15 wherein the film substrate is a blown film.

23. The method of claim 15 wherein the film substrate is a bio-based polymer film.

24. The method of claim 15 wherein the film substrate comprises a core polymer layer selected from the group consisting of polyethylene, polypropylene, polystyrene, polylactic acid, polyethylene terephthalate, polyesters, and copolymers thereof and mixtures thereof.

25. The method of claim 15, wherein between the depositing a first inorganic nanocoating layer step and the depositing a metal layer step, the coated film substrate is wound.

\* \* \* \* \*